US012588155B2

(12) United States Patent
Stewart, Jr.

(10) Patent No.: US 12,588,155 B2
(45) Date of Patent: Mar. 24, 2026

(54) PORTABLE CONTAINER FOR AN INDUSTRIAL BATTERY CHARGER

(71) Applicant: Toyota Material Handling, Inc., Columbus, IN (US)

(72) Inventor: Harold Stewart, Jr., Columbus, IN (US)

(73) Assignee: Toyota Material Handling, Inc., Columbus, IN (US)

( * ) Notice: Subject to any disclaimer, the term of this patent is extended or adjusted under 35 U.S.C. 154(b) by 282 days.

(21) Appl. No.: 18/542,726

(22) Filed: Dec. 17, 2023

(65) Prior Publication Data

US 2024/0206091 A1 Jun. 20, 2024

Related U.S. Application Data

(60) Provisional application No. 63/476,094, filed on Dec. 19, 2022.

(51) Int. Cl.
*H02G 3/04* (2006.01)
*H02J 7/00* (2006.01)
*H05K 5/02* (2006.01)

(52) U.S. Cl.
CPC ............. *H05K 5/0217* (2013.01); *H02G 3/04* (2013.01); *H02J 7/0042* (2013.01); *H05K 5/0213* (2013.01)

(58) Field of Classification Search
CPC ...... H05K 5/0217; H05K 5/0213; H02G 3/04; H02J 7/0042
USPC .......................................... 174/520
See application file for complete search history.

(56) References Cited

U.S. PATENT DOCUMENTS

2023/0067327 A1* 3/2023 Fletcher .................. B60R 11/06

* cited by examiner

*Primary Examiner* — Timothy J Thompson
*Assistant Examiner* — Michael F Mcallister
(74) *Attorney, Agent, or Firm* — Husch Blackwell LLP

(57) ABSTRACT

A portable container for an industrial battery charger is provided. The portable container includes a housing with a removably coupled top portion. The portable container also includes two or more access holes provided in the form of pockets for forklift tines. The portable container includes a power adapter, cable management device(s), and a document enclosure. The portable container can also include a structural support system to stabilize the battery charger and one or more ventilation apertures to provide cooling and airflow to the battery charger.

20 Claims, 6 Drawing Sheets

PORTABLE CONTAINER FOR AN INDUSTRIAL BATTERY CHARGER

CROSS-REFERENCE TO RELATED APPLICATIONS

This application claims the benefit of U.S. Provisional Patent Application No. 63/476,094, filed Dec. 19, 2022, the entire disclosure of which is incorporated by reference herein.

BACKGROUND

Conventional industrial battery chargers can be expensive and are often stored in or transported to outdoor locations. Some industrial battery chargers include advanced features like Wi-Fi connectivity, communication modules, displays, auto-bypass, integrated monitoring, etc. Even if the battery chargers are provided in outdoor-rated enclosures, these enclosures can be dropped, damaged, dented, etc., which can impact the integrity and functionality of the interior components of the battery charger.

Additionally, typical battery charger systems often include ancillary components, like cables, connectors or adapters, manuals, etc. These components can also become damaged or lost and are typically not rated to withstand outdoor or harsh environmental conditions like dust, wind, snow, or rain. For example, cables and connectors are often positioned on the ground next to the battery charger or disposed on top of the battery charger housing. The cables can be damaged by other equipment, impacting the integrity of the cable and the associated electrical connection. The battery chargers, cables, adapters, and/or associated components may be damaged in loading, unloading, transportation, and/or during use or storage in harsh environmental conditions.

Rental companies provide industrial battery chargers as a rental option and can often encounter issues with damaged enclosures and loose or missing components. Even if the enclosure is intact, damage to internal components can cost thousands of dollars to replace or repair. Additionally, rental providers can't hardwire battery chargers. Instead, the chargers must be portable and able to be loaded onto a truck bed or trailer to be transported to a job site for use. In these instances, a wooden pallet is often used to lift and transport the charger(s). The chargers are sometimes stored outside for rental delivery or pick-up, leaving the charger and ancillary components subject to weather and other environmental conditions. The wooden pallets can be unstable, resulting in damage from being dropped during the unloading and loading processes. Additionally, sometimes the binding straps used to secure the chargers during transportation can be overtightened, resulting in dented, bent, or otherwise damaged enclosures.

SUMMARY

An aspect of this disclosure pertains to a system provided in the form of a portable container for transporting and storing an industrial battery charger.

A portable container for transporting and storing an industrial battery is provided. The portable container includes a housing with a removably coupled top portion and two or more access holes provided in the form of pockets located on a bottom portion of the housing configured to receive forklift tines. The portable container also includes a power adapter attached to a first interior face of the housing. The portable container can also include a first cable management device attached to a second interior face of the housing and a second cable management device attached to a third interior face of the housing. The portable container can further include a structural support attached to a bottom interior face of the housing configured to at least partially secure the industrial battery charger. The housing further includes one or more ventilation apertures located on the bottom interior face thereof. The portable container can also include a document enclosure located on the second interior face of the housing.

In some aspects, the power adapter is provided in the form of an SB175 power connector. In some forms, the first cable management device and the second cable management device are provided in the form of a first eyelet hook and a second eyelet hook. In some embodiments, the first cable management device and the second cable management device are provided in the form of a first utility hook and a second utility hook. In some aspects, the portable container further includes a third cable management device, wherein the third cable management device is located on the third interior face of the housing. In some forms, the third cable management device is provided in the form of an eyelet hook. The housing can also include one or more access doors provided in the form of a hinged drop door. In some forms, the one or more access doors include a gasket for sealing the access door to the housing when closed. The portable container may also include a removable container located inside the housing, wherein the removable container is designed to hold a neutralizing agent.

In another aspect, a portable container for transporting and storing an industrial battery charger is provided. The portable container includes a housing including a removably coupled top portion and two or more access holes located on a bottom portion of the housing provided in the form of pockets configured to receive forklift tines. The portable container further includes at least one cable management device attached to an interior face of the housing. The portable container can also include a structural support attached to a bottom interior face of the housing and one or more ventilation apertures located on the bottom interior face of the housing.

In some forms, the portable container also includes a power adapter attached to an interior face of the housing. In some aspects, the at least one cable management device is provided in the form of an eyelet hook. In some embodiments, the at least one cable management device is provided a first distance above the bottom interior face of the housing, wherein an uppermost edge of the interior face of the housing that the at least one cable management device is attached to is located a second distance above the bottom interior face of the housing, and wherein the first distance is at least 50% of the second distance.

In another aspect, a portable container for transporting and storing an industrial battery charger is provided. The portable container can include a housing including a removably coupled top portion and two or more access holes located on a bottom portion of the housing provided in the form of pockets configured to receive forklift tines. The portable container can further include a first cable management device and a second cable management device attached to the housing. The portable container may also include a structural support attached to a bottom interior face of the housing and one or more ventilation apertures located on the bottom interior face of the housing.

In some aspects, the first cable management device and the second cable management device are each separately attached to a first interior face of the housing. In some forms, the first cable management device is attached to a first interior face of the housing, and the second cable management device is attached to a second interior face of the housing. In some embodiments, the portable container further includes a third cable management device, wherein the third cable management device is attached to the first interior face of the housing.

Some embodiments provide a portable container for transporting and storing an industrial battery charger. The portable container can include a housing with a removably coupled top portion to allow access to the charger and associated components. The portable container can also include two or more access holes located on the bottom portion of the housing. In some aspects, the access holes are provided in the form of pockets for forklift tines to securely load and unload the portable container. A power adapter and document enclosure can be secured to one or more of the interior faces of the portable container. In some embodiments, the power adapter may be provided in the form of an SB175 power connector. The portable container can also include one or more cable management devices provided in the form of eyelet hooks or utility hooks. The cable management devices are located on the interior faces of the portable container and are designed to releasably store the charging cables. In some forms, a structural support system is provided on a bottom interior face of the portable container and is designed to stabilize the battery charger during loading, unloading, and transportation. In some forms, the housing may include one or more access doors, which can be provided in the form of hinged access doors. In some embodiments, the access doors may be located on a front and/or back panel of the housing. In some embodiments, the portable container may further include a removable container designed to hold a neutralizing agent.

DETAILED DESCRIPTION

Figure 1:
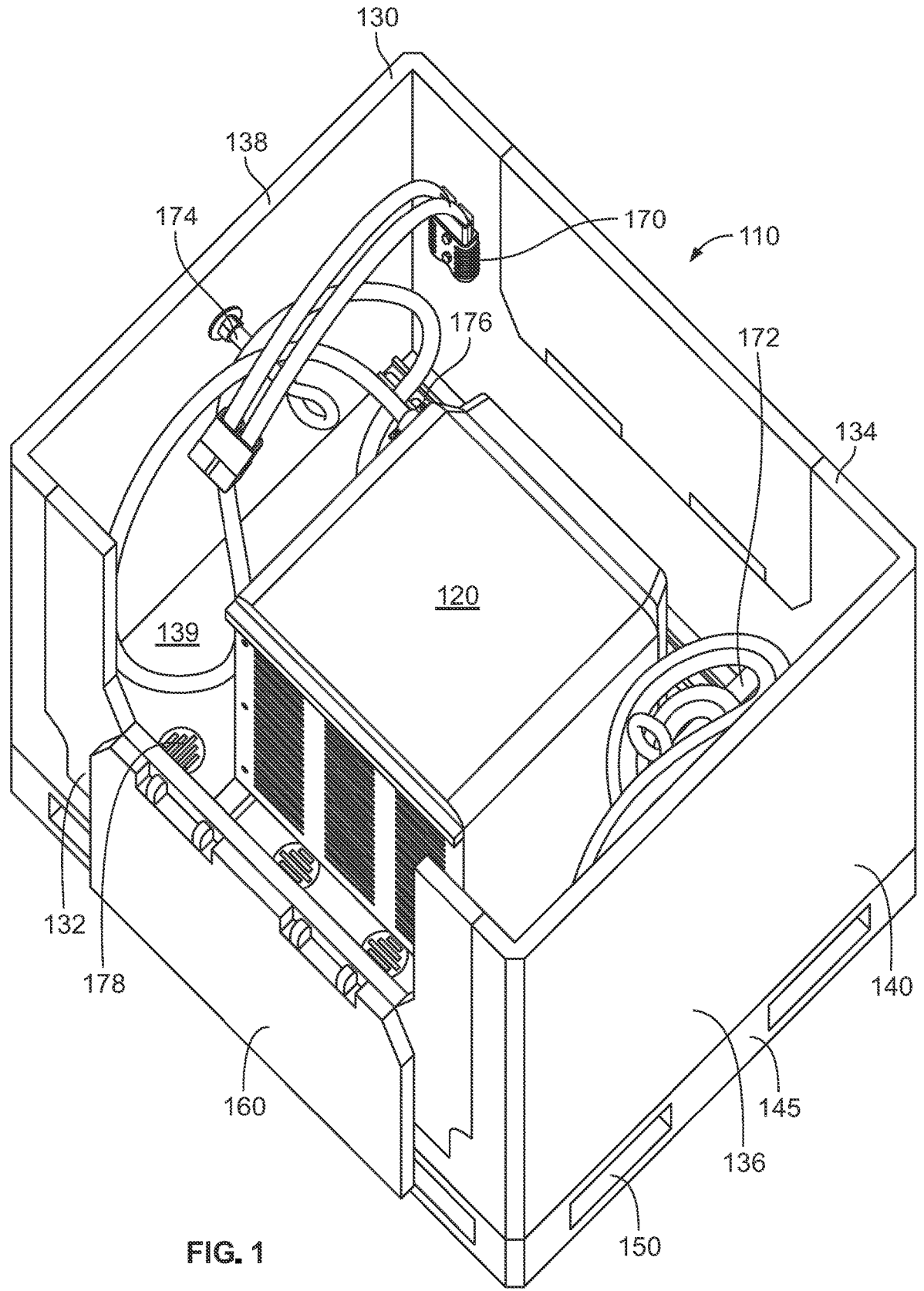
FIG. 1 is a severe isometric view of a rear, top, and first side view of the inside of the portable container for an industrial battery charger according to one embodiment, with a top panel removed and a rear access door lowered, for clarity.

The following discussion is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives and fall within the scope of embodiments of the invention.

Before any embodiments of the invention are explained in detail, it is to be understood that the invention is not limited in its application to the details of construction and the arrangement of components outlined in the following description or illustrated in the attached drawings. The invention is capable of other embodiments and of being practiced or of being carried out in various ways. Also, it is to be understood that the phraseology and terminology used herein are for the purpose of description and should not be regarded as limiting. For example, the use of "including," "comprising," or "having" and variations thereof herein is meant to encompass the items listed thereafter and equivalents thereof as well as additional items.

As used herein, unless otherwise specified or limited, the terms "mounted," "connected," "supported," and "coupled" and variations thereof are used broadly and encompass both direct and indirect mountings, connections, supports, and couplings. Further, unless otherwise specified or limited, "connected" and "coupled" are not restricted to physical or mechanical connections or couplings.

FIG. 1 illustrates a portable container 110 for transporting and storing an industrial battery charger 120. The portable container 110 can comprise a substantially rectilinear housing 130 provided in the form of a top portion 140 and a bottom portion 145. The bottom portion 145 acts as a base and the top portion 140 is defined by various sidewalls or panels extending upwardly therefrom. In one instance, the bottom portion 145 of the portable container 110 may be designed as a pallet-style base, so that the portable container 110 may be easily moved with material handling equipment and/or a pallet jack. The bottom portion 145 of the housing 130 can include one or more access holes 150, which may be provided in the form of a pocket for receiving forklift tines or other lifting or transportation devices. In some instances, the bottom portion 145 has two rectilinear access holes 150. The access holes 150 may extend partially or entirely through the bottom portion 145 of the housing 130. In some embodiments, the housing 130 can include one or more rotatable access doors 160. The portable container 110 can further include a power adapter 170, a document enclosure 172, one or more cable management devices 174, a structural support system 176 (see FIG. 2), and one or more ventilation apertures 178.

In some embodiments, the industrial battery charger 120 can be provided in the form of a battery charger for material handling equipment (e.g., lift trucks, pallet jacks, boom lifts, forklifts, etc.), in one non-limiting example. Other types of battery charger units, including industrial, commercial, and large residential battery chargers can be used with the portable container 110, in some embodiments.

In one non-limiting embodiment, the portable container 110 may be provided with the approximate dimensions 50" H×48" W×40" D to transport an industrial battery charger 120 with the approximate dimensions 36" H×20" W×18" D. In a further example, the portable container 110 may be provided with the approximate dimensions 50" H×48" W×45" D, or with the approximate dimensions of 50" H×45" W×48" D to transport an industrial battery charger 120 with the approximate dimensions 42" H×30" W×30" D. In another example, the portable container 110 may be provided with the approximate dimensions 34" H×32" W×30" D to transport an industrial battery charger 120 with the approximate dimensions 20" H×14" W×14" D. In a further example, the portable container 110 may be provided with the approximate dimensions 34" H×30" W×32" D, or with the approximate dimensions 34" H×32" W×30" D to transport an industrial battery charger 120 with the approximate dimensions 23" H×14" W×14" D. In some embodiments, the portable container 110 may be constructed to provide the industrial battery charger 120 with at least 6" of clearance in all directions (i.e., the difference between the exterior wall of the charger 120 and the interior wall of the portable container 110). It will be understood by one skilled in the art that the portable container 110, although described for use with the industrial battery charger 120, can also be provided in various dimensions for use with other types of battery chargers or other types of equipment.

The portable container 110 includes the housing 130, which is defined by a top panel 510 (see FIG. 5), a rear panel 132, a front panel 134, a first side panel 136, a second side panel 138, and a bottom panel 139. Each of the top panel 510, the rear panel 132, the front panel 134, the first side panel 136, the second side panel 138, and the bottom panel 139 includes an interior face and an exterior face.

In some embodiments, the housing 130 may be constructed as one uniform body. In other embodiments, the housing 130 may be constructed with individual panels coupled together. Some embodiments can include a combination of portions of the housing 130 constructed as one uniform body with other portions coupled to the uniform body (e.g., the side panels constructed as a uniform body with the top panel 510 and bottom panel 139 coupled to the uniform body). In some embodiments, the top portion 140 of the housing may comprise separate panels from the bottom portion 145 of the housing 130. In some embodiments, the top portion 140 may be constructed as a first uniform body and coupled to the bottom portion 145, provided in the form of a second uniform body. It will be understood that as used herein "uniform" can include a construction wherein all sides or panels are manufactured out of a single piece of material or otherwise constructed as a single continuous unit. In some embodiments, the housing 130 can be constructed using other techniques, configurations, manufacturing methods, assembly variations, and similar. In some embodiments, the housing 130 may be made of or provided in the form of a hard-plastic material or other suitable rigid, water-proof, and corrosion-resistant material. A non-limiting example may be a coated metal or a heavy-duty rubber. The housing 130 material may be made of a strong and durable material to help avoid damage to the industrial battery charger 120 and to increase the lifespan of the portable container 110 as the portable container is transported, handled, and otherwise exposed to damaging conditions, such as weather conditions and the like.

The bottom portion 145 of the housing 130 can also include two or more access holes 150 extending therethrough. The two or more access holes 150 can be provided in the form of rectilinear pockets designed to receive forklift tines. In some embodiments, the access holes 150 are provided on all four sides of the portable container 110. In this example, the portable container 110 is designed to be picked up, loaded, and/or moved by a forklift, or other industrial machine, regardless of the orientation of the portable container 110. In some embodiments, the bottom portion 145 of the housing 130 includes a lower portion of the exterior face of the rear panel 132, the front panel 134, the first side panel 136, and the second side panel 138. In this embodiment, the two or more access holes 150 can be manufactured in the lower portion of each of the rear panel 132, the front panel 134, the first side panel 136, and the second side panel 138. The access holes 150 may also be used to tie down or stabilize the portable container 110 once it has been moved to a desired location, for example, on a truck bed for further transportation.

In some embodiments, the housing 130 can include one or more access doors 160 in one or more of the panels of the portable container 110. The one or more access doors 160 can be provided in the form of a hinged drop door, drop gate, or similar. In some embodiments, the one or more access doors 160 may be located on the rear panel 132 and the front panel 134, as shown in FIG. 1. In some embodiments, the portable container 110 may be provided without any access doors 160, with a single access door 160, or with access doors 160 shown in different configurations than those represented in the figures. In some embodiments, the one or more access doors 160 can provide access to the industrial battery charger 120 and/or the associated cables, power adapter 170, document enclosure 172, or other components of the portable container 110. It will be understood that the one or more access doors 160 may be coupled to the portable container 110 using other fastening and/or joining techniques rather than a hinge (e.g., snap, screw, pin, slot, etc.).

The portable container 110 can further include the power adapter 170. In some embodiments, the power adapter 170 is coupled to the interior face of the front panel 134. In this example, the power adapter 170 is secured to the portable container 110 to prevent the power adapter 170 from being lost during transportation and use of the industrial battery charger 120 and therefore eliminates loose components that may be easily misplaced or damaged. In some embodiments, the power adapter 170 is coupled to a first interior face of the portable container 110, wherein the first interior face is adjacent to a second interior face and a third interior face. In some embodiments, the portable container 110 includes a receptacle (not shown) for holding the power adapter 170. The receptacle may be fixedly attached to an interior face of the portable container 110. The receptacle may lock the power adapter 170 in place to prevent misplacement but may include a feature to unlock the power adapter 170 for quick removal if needed. In one embodiment, the first interior face of the portable container 110 is the interior face of the front panel 134. In some embodiments, the power adapter 170 is mounted to a second side of the front panel 134 and can be mounted adjacent to the access door 160 to provide convenient access to the power adapter 170.

In some embodiments, the power adapter 170 is provided in the form of an SB175 power connector. In some embodiments, the power adapter 170 may be provided in the form of an SB350 power connector. In some embodiments, the power adapter 170 may include one or more adapters or power connectors including, but not limited to an adapter configured to accommodate power connections from about 12V to about 600V. Some embodiments may include multiple power adapters, and/or conversion adapters to allow for multiple devices with varying electrical demand requirements to be connected to the industrial battery charger 120. In some embodiments, multiple power adapters can be provided to allow multiple devices to be charged at once. For example, the power adapter 170 may be provided in the form of a multi-port adapter to be able to charge an industrial battery (not shown) while also charging ancillary devices like a cell phone, a walkie-talkie, etc.

Figure 2:
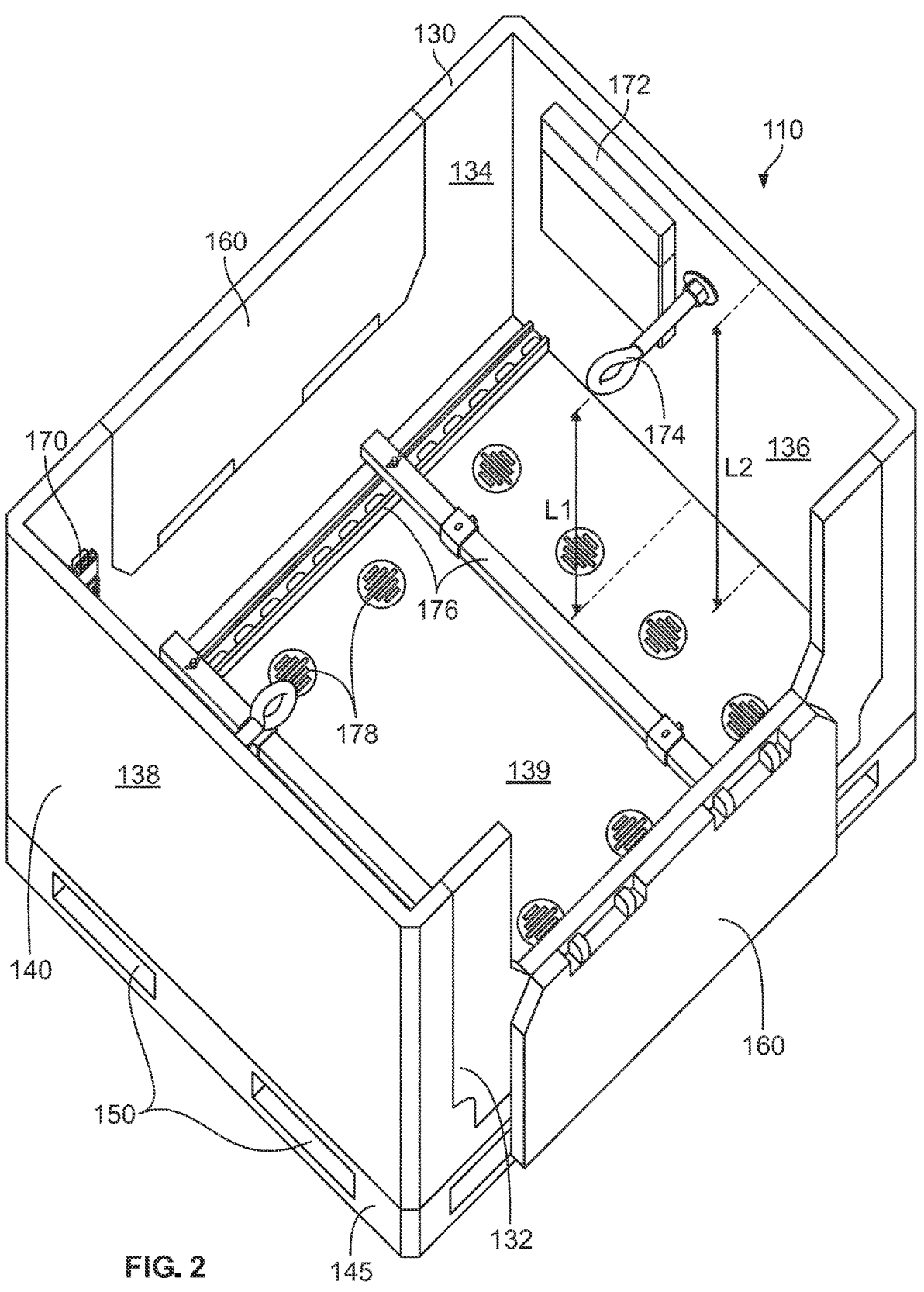
FIG. 2 is a severe isometric view of a rear, top, and second side view of the inside of the portable container for an industrial battery charger of FIG. 1, with the battery charger and associated cables removed, the top panel removed, and the rear access door lowered, for clarity.

FIG. 2 illustrates the portable container 110 without the industrial battery charger 120 and associated cables. As shown more clearly in FIG. 2, in addition to the components described in connection with FIG. 1, the portable container 110 can also include a document enclosure 172, one or more cable management devices 174, the structural support system 176, and one or more ventilation apertures 178.

The document enclosure 172 is designed to receive and hold manuals, technical documents, instructions, contact information for a rental provider, power connection data, or other information. In some embodiments, the document enclosure 172 may be provided in the form of a plastic storage box. This example is not limiting and many other types of enclosures can be provided, including enclosures of different materials, sizes, fastening techniques, etc. In some embodiments, the document enclosure 172 may be provided in the form of an adjustably sized enclosure (e.g., accordion file configuration) to accommodate many documents. In some embodiments, the document enclosure 172 is coupled to the second interior face of the portable container 110, wherein the second interior face is adjacent to the first interior face and a fourth interior face. In one embodiment, the second interior face of the portable container 110 is the interior face of the first side panel 136. In some embodiments, the document enclosure 172 is mounted towards a front side of the first side panel 136 and can be mounted adjacent to one of the one or more cable management devices 174.

Figure 3:
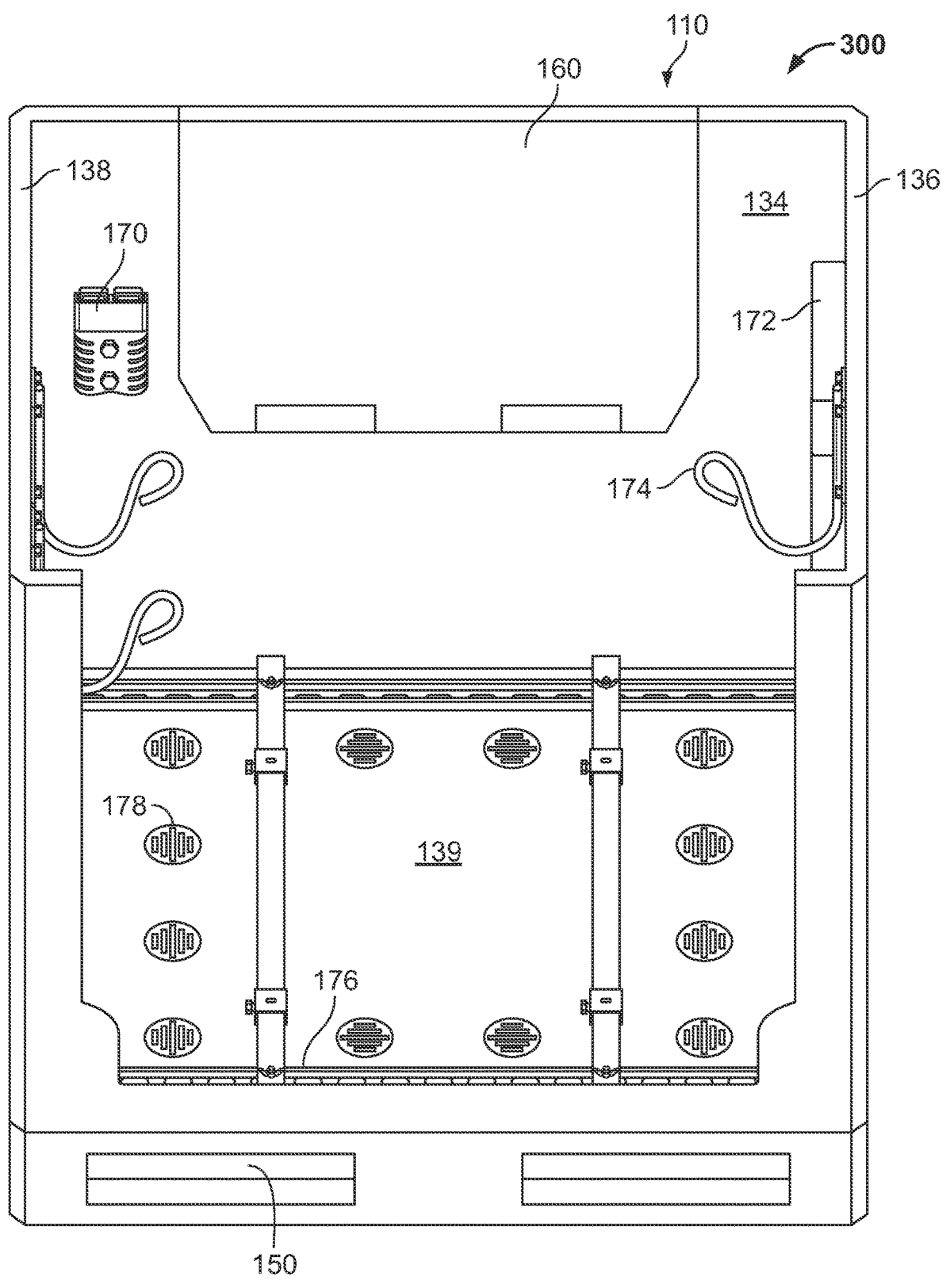
FIG. 3 is a raised isometric view of the inside of a portable container for an industrial battery charger, with the top panel and rear panel removed for clarity, according to one embodiment.

The portable container 110 may further include one or more cable management devices 174. In one instance, the one or more cable management devices 174 may be coupled to or adjacent at least one panel 136, 138, 139. In some embodiments, the one or more cable management devices 174 can be provided in the form of at least one hook or a plurality of hooks designed to hold charging cables associated with the industrial battery charger 120 (as shown in FIG. 1). The cable management devices 174 may enable more organized storage of the charging cables, which can prevent damage to the cables and can provide easier access to the cables for a user. In one instance, the cable management devices 174 may be designed to hold or manage components other than or in addition to (e.g., charging) cables. In some embodiments, as shown in FIG. 2, the cable management devices 174 may be provided in the form of eyelet hooks such as a (e.g., zinc) eye bolt or similar. In some embodiments, the one or more cable management devices 174 may include a protective covering, like silicone, rubber, or similar. In this example, the protective coating can be used to protect the charging cables. As shown in FIG. 3, the cable management devices 174 can also be provided in the form of other types of hooks. As shown in FIG. 2, the cable management devices 174 may be located a distance L1 above the bottom panel 139, which may be at least 50% of the vertical distance L2 from the bottom panel 139 to an upper edge of the side panels 136, 138 (i.e., where the top panel 510 engages the housing 130). Locating the cable management devices 174 in the upper portion of the side panels 136, 138 can place the cable management devices 174, and by consequence the cables held by the cable management devices 174, at an ergonomically and user-friendly access height. In some embodiments, the distance L1 may be approximately 70% to about 90% of L2. In some embodiments, the distance L1 may be approximately 85% of L2.

In some embodiments, the one or more cable management devices 174 are coupled to the second interior face of the portable container 110, wherein the second interior face is adjacent to the first interior face and a fourth interior face. In one embodiment, the second interior face of the portable container 110 is the interior face of the first side panel 136. In some embodiments, a second cable management device 174 is coupled to the third interior face of the portable container 110, opposite the first cable management device 174 coupled to the second interior face. In this example, the third interior face is the interior face of the second side panel 138.

The portable container 110 can further include the structural support system 176. In some embodiments, the structural support system 176 can be provided in the form of two or more structural supports, which may be channels, frames, beams, boards, tubes, plates, rods, or similar support structures. In one instance, the structural supports may be adjustable. In some embodiments, the structural support system 176 can be coupled to the interior face of the bottom panel 139. In some embodiments, the structural support system 176 is designed to stabilize and/or secure the industrial battery charger 120 when the industrial battery charger 120 is mounted thereto. In some embodiments, the industrial battery charger 120 may be mounted to the structural support system 176 using brackets, screws, fasteners, clamps, and/or other locking mechanisms. In one instance, the structural support system 176 has at least two structural supports spaced a distance apart from one another, such that the distance is designed to fit the industrial battery charger 120 between the at least two structural supports. In other embodiments, a portion of the structural support system 176 may be extended upwardly to provide lateral support to a portion of the industrial battery charger 120, which can provide stability to the industrial battery charger 120. The structural support system 176 may be designed to distribute the weight of the industrial battery charger 120 over a larger surface area of the bottom panel 139. It will be understood by one skilled in the art, that although a "structural support system" is used, the stabilizing component is not necessarily supporting the structure of the portable container 110. Although the embodiment shown in the figures includes two parallel support pieces perpendicular to two other support pieces installed parallel to one another, it will be appreciated that alternative configurations can be utilized in some embodiments, including but not limited to, two parallel supports, two supports perpendicular to one another, or one large support.

The portable container 110 can also include the one or more ventilation apertures 178 designed to provide ventilation and airflow to the industrial battery charger 120. In one instance, the one or more ventilation apertures 178 are formed within, through, or near at least one panel 136, 138, and/or 139. As shown in FIG. 2, for example, the panel 139 has at least one ventilation aperture 178 formed therein. In one instance, at least one ventilation aperture 178 may be drilled into or formed within the panel 139 and a vent cover, or the like, may be coupled to or positioned within or near the ventilation aperture 178 to act as a cover. In some embodiments, the ventilation apertures 178 can include holes, vents, slots, chutes, drains, nozzles, covers, or other types of openings to allow air to flow in and out of the portable container 110. This airflow can help with air quality and temperature regulation of the interior of the portable container 110, which can otherwise reach undesirable levels due to the operation of the industrial battery charger 120 in an enclosed space. While the figures illustrate an example configuration, the layout, size, shape, orientation, and over-all configuration of the ventilation apertures 178 is in no way limited by these illustrative examples. In one instance, the ventilation aperture 178 is shown as having a round shape in FIG. 2; however, the ventilation aperture 178 may be provided in other suitable shapes. In some embodiments, the ventilation apertures 178 may extend only through the bottom panel 139 and be open to the one or more access holes 150. Thus, airflow may ingress and egress through the access holes 150 on the sides of the portable container 110, which will not be blocked even if the portable container 110 is resting on a solid surface or ground. In some embodiments, the ventilation apertures 178 may be provided with covers to allow for dynamic ventilation configurations as different-sized battery chargers or other types of equipment are mounted inside the portable container 110.

In some embodiments, the ventilation apertures 178 can be located on and can extend the entire way through the bottom panel 139. In some embodiments, the ventilation apertures 178 can be located on any of the other panels of the portable container 110. In some embodiments, the portable container 110 can also include a plug, port, drain, or similar opening (not shown) for removing water from the portable container 110. In some embodiments, ventilation apertures 178 located on the bottom panel 139 can act as a drain for removing water in addition to allowing airflow into and out of the interior.

FIG. 3 illustrates an alternative embodiment 300 for the one or more cable management devices 174, with the rear panel 132 omitted for clarity. In the alternative embodiment 300, a third cable management device 174 can be provided. In some embodiments, as shown in FIG. 3, the third cable management device 174 can be coupled to the third interior face of the portable container 110, where the third interior face can be the interior face of the second side panel 138. In some embodiments, the third cable management device 174 can be mounted toward a back side of the third interior face, adjacent to the fourth interior face. In some embodiments, the third cable management device 174 can be mounted to the second interior face, such that there are two cable management devices on the second interior face. In some embodiments, the third cable management device 174 can be mounted to any of the other interior surfaces of the portable container 110. In general, any number of cable management devices 174 may be located on the interior surfaces of the portable container 110, and three cable management devices 174 may be distributed on the same or different interior surfaces of the portable container 110.

FIG. 3 also illustrates an embodiment of the one or more cable management devices 174 provided in the form of hooks. It will be understood that the one or more cable management devices 174 (e.g., eyelet hook and utility hook) are examples shown in FIGS. 1-4 and are not limiting. The cable management devices 174 can be provided in the form of any type of hook, hanger, peg, or similar structure for hanging and storing charging cables.

Figure 4:
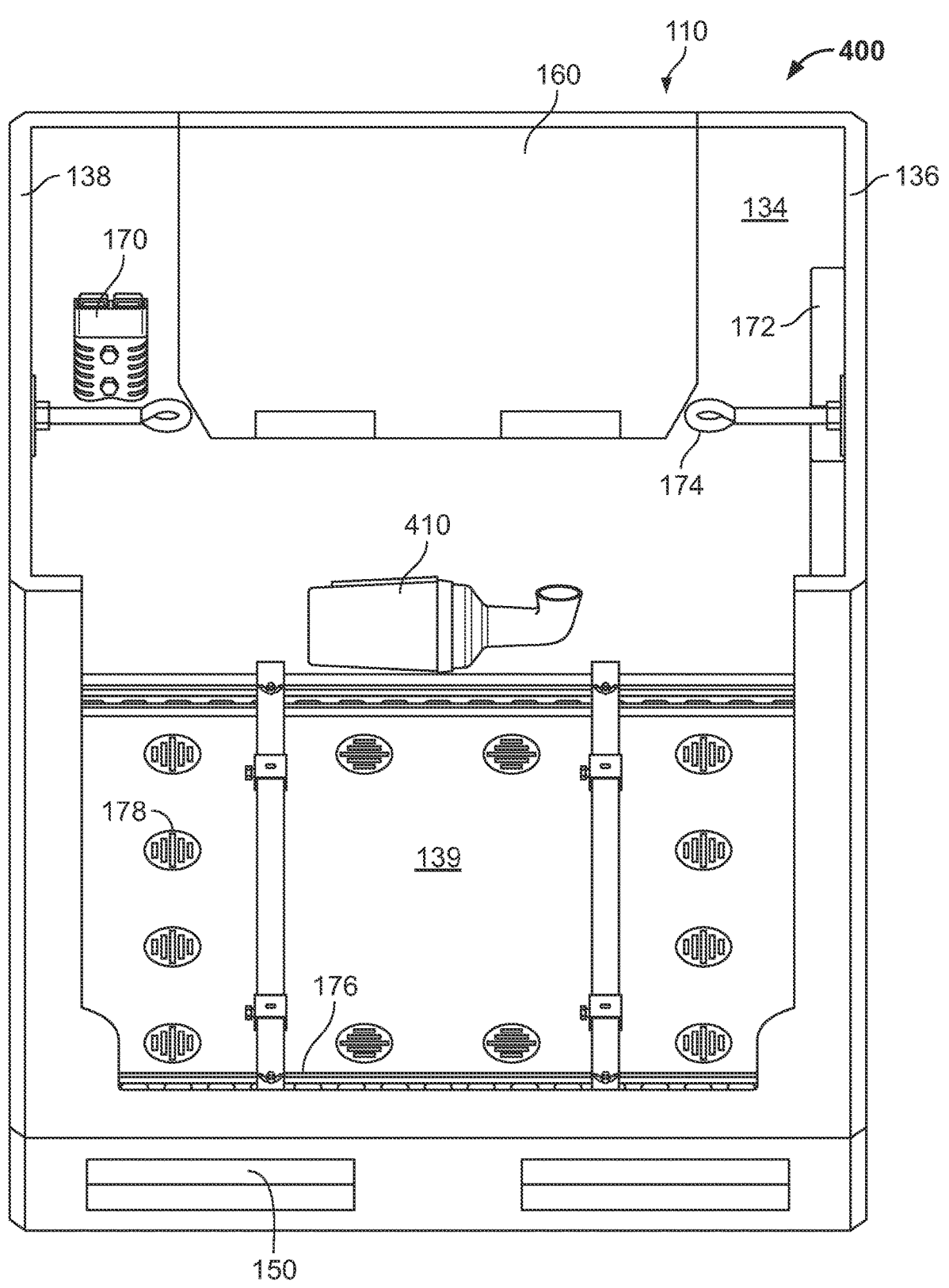
FIG. 4 is a raised isometric view of the inside of a portable container for an industrial battery charger, with the top panel and rear panel removed for clarity, according to one embodiment.

FIG. 4 illustrates an alternative embodiment 400 of the portable container 110 further comprising a removable container 410 designed to hold a neutralizing agent. In some embodiments, the removable container 410 may be provided in the form of a plastic bottle with a curved nozzle. In some embodiments, the removable container 410 can be provided in the form of a container with a removably coupled lid. Other embodiments include other types of storage containers or similar. In some embodiments the neutralizing agent may include baking soda, or similar, to allow for convenient neutralization in the event of an acid spill, as sometimes occurs during the battery charging process. In some embodiments, the removable container 410 may be coupled to the first interior face of the housing 130. In some embodiments, the removable container 410 may be coupled to the interior face of the front panel 134. In some embodiments, the removable container 410 may be coupled to the portable container 110 via a holder designed to hold the removable container 410. In some embodiments, the removable container 410 can be mounted parallel to a bottom edge of the front panel 134. In some embodiments, the removable container 410 can be mounted vertically, adjacent to the first side panel 136. In some embodiments, the removable container 410 can be located adjacent to an access door 160.

Figure 5:
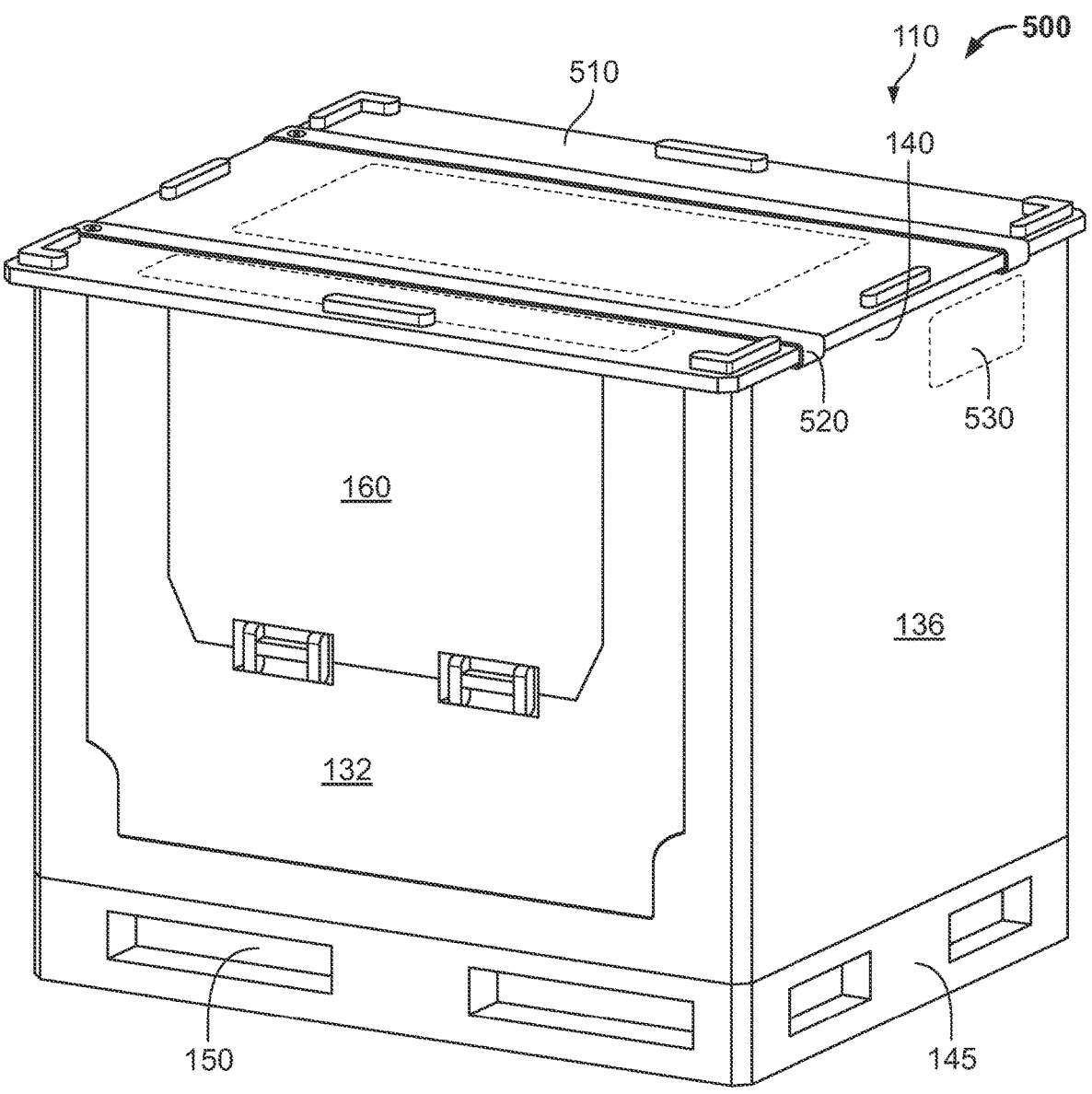
FIG. 5 is an isometric view of a rear, top, and first side view of a portable container for an industrial battery charger in a closed configuration according to one embodiment.
Figure 6:
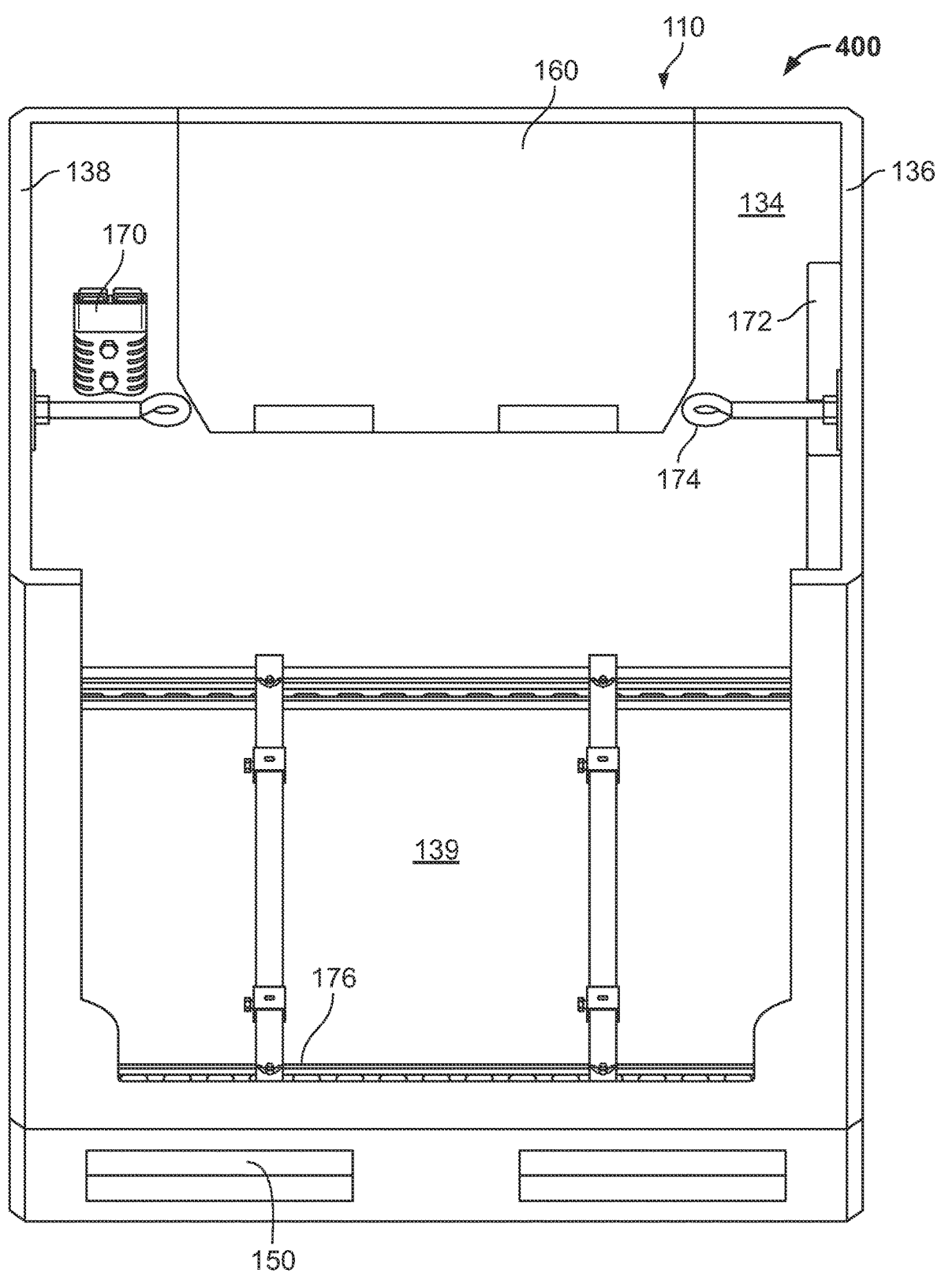
FIG. 6 is a raised isometric view of the inside of a portable container for an industrial battery charger, with the top panel and rear panel removed for clarity, according to one embodiment.

FIG. 5 illustrates a fully assembled view 500 of the portable container 110 for transporting and storing an industrial battery charger 120 (see FIG. 1) according to one embodiment. The embodiment shown in FIG. 5 includes the top panel 510. In some embodiments, the top panel 510 can be secured to the top portion 140 of the housing 130 using one or more fasteners 520. In some embodiments, the fasteners 520 can include straps, like tic-down straps, bungee cords, or similar securing devices. In some embodiments, the top portion 140 of the housing may include a fastener receiver (not shown) to releasably couple to the one or more fasteners 520. In some embodiments, the fasteners 520 can extend around the housing and be secured to the bottom portion 145 of the housing and/or to the exterior face of the bottom panel 139.

In some embodiments, the top panel 510 and access doors 160 may include a gasket or seal, such as a rubber, polymeric, or sponge-type gasket, surrounding the edges of the top panel 510 and/or access door 160 to help seal the interior of the portable container 110 from the external environment and contaminants, such as dust or rain. In some embodiments, the gasket or seal may be included on the portion of the portable container 110 that receives the top panel 510 or access door 160 when each is closed.

Some embodiments can also include one or more labels 530 disposed on an exterior portion of the portable container 110. In some embodiments, the labels 530 may be used for marketing purposes, such as the logo of the rental provider. In some embodiments, the labels 530 may be used to convey other information, like technical data related to the industrial battery charger 120, inspection dates, part numbers, or other data.

In one instance, the portable container 110 may be shipped fully assembled. For example, the portable container 110 may be assembled and shipped with at least one of the power adapter 170, the document enclosure 172, one or more cable management devices 174, and/or the structural support system 176 coupled and/or installed therein. The portable container 110 also may be shipped and/or assembled with more or fewer components. The portable container 110 may be designed to assist with the organization of supplies and/or components for use with and/or storage of the industrial battery charger 120.

In other embodiments, other configurations are possible. For example, those of skill in the art will recognize, according to the principles and concepts disclosed herein, that various combinations, sub-combinations, and substitutions of the components discussed above can provide appropriate control for a variety of different configurations of portable containers for battery chargers, industrial equipment, power generation equipment, and so on, for a variety of applications.

The previous description of the disclosed embodiments is provided to enable any person skilled in the art to make or use the invention. Various modifications to these embodiments will be readily apparent to those skilled in the art, and the generic principles defined herein may be applied to other embodiments without departing from the spirit or scope of the invention. Thus, the invention is not intended to be limited to the embodiments shown herein but is to be accorded the widest scope consistent with the principles and novel features disclosed herein.

What is claimed is:

1. A portable container for transporting and storing an industrial battery charger, the portable container comprising:
    a housing including a removably coupled top portion;
    two or more access holes located on a bottom portion of the housing, wherein the two or more access holes are provided in the form of pockets configured to receive forklift tines;
    a power adapter attached to a first interior face of the housing;
    a first cable management device attached to a second interior face of the housing;
    a second cable management device attached to a third interior face of the housing;
    a structural support attached to a bottom interior face of the housing;
    one or more ventilation apertures located on the bottom interior face of the housing; and
    a document enclosure located on the second interior face of the housing.

2. The portable container of claim 1, wherein the power adapter is provided in the form of an SB175 power connector.

3. The portable container of claim 1, wherein the first cable management device and the second cable management device are each provided in the form of an eyelet hook.

4. The portable container of claim 1, wherein the first cable management device and the second cable management device are each provided in the form of a utility hook.

5. The portable container of claim 1 further comprising a third cable management device.

6. The portable container of claim 5, wherein the third cable management device is located on the third interior face of the housing.

7. The portable container of claim 5, wherein the third cable management device is provided in the form of an eyelet hook.

8. The portable container of claim 5, wherein the third cable management device is provided in the form of a utility hook.

9. The portable container of claim 1, wherein the housing includes one or more access doors.

10. The portable container of claim 9, wherein the one or more access doors are provided in the form of a hinged drop door.

11. The portable container of claim 1 further comprising a removable container located inside the housing, wherein the removable container is designed to hold a neutralizing agent.

12. The portable container of claim 1, wherein the one or more access doors include a gasket for sealing the access door to the housing when closed.

13. A portable container for transporting and storing an industrial battery charger, the portable container comprising:
    a housing including a removably coupled top portion;
    two or more access holes located on a bottom portion of the housing provided in the form of pockets configured to receive forklift tines;
    at least one cable management device attached to an interior face of the housing;
    a structural support attached to a bottom interior face of the housing; and
    one or more ventilation apertures located on the bottom interior face of the housing.

14. The portable container of claim 13 further comprising a power adapter attached to an interior face of the housing.

15. The portable container of claim 13, wherein the at least one cable management device is provided in the form of an eyelet hook.

16. The portable container of claim 13, wherein the at least one cable management device is provided a first distance above the bottom interior face of the housing and an uppermost edge of the interior face of the housing that the at least one cable management device is attached to is located a second distance above the bottom interior face of the housing, and wherein the first distance is at least 50% of the second distance.

17. A portable container for transporting and storing an industrial battery charger, comprising:
    a housing including a removably coupled top portion;
    two or more access holes located on a bottom portion of the housing configured to receive forklift tines;
    a first cable management device attached to the housing;
    a second cable management device attached to the housing;
    a structural support attached to a bottom interior face of the housing; and
    one or more ventilation apertures located on the bottom interior face of the housing.

18. The portable container of claim 17, wherein the first cable management device and the second cable management device are each separately attached to a first interior face of the housing.

19. The portable container of claim 17, wherein the first cable management device is attached to a first interior face of the housing, and wherein the second cable management device is attached to a second interior face of the housing.

20. The portable container of claim 19 further comprising a third cable management device, wherein the third cable management device is attached to the first interior face of the housing.

\* \* \* \* \*